United States Patent [19]

Ohishi et al.

[11] 4,307,147

[45] Dec. 22, 1981

[54] HIGHLY THERMAL CONDUCTIVE AND ELECTRICAL INSULATING SUBSTRATE

[75] Inventors: Naoaki Ohishi, Machida; Toshiaki Sakaida, Shiojiri; Mitsuru Hasegawa, Shiojiri; Iwao Hiramatsu, Shiojiri, all of Japan

[73] Assignee: Showa Denko Kabushiki Kaisha, Tokyo, Japan

[21] Appl. No.: 182,785

[22] Filed: Aug. 29, 1980

[30] Foreign Application Priority Data

Aug. 30, 1979 [JP] Japan .................................. 54/109666

[51] Int. Cl.³ ....................... B32B 15/08; B32B 15/16; B32B 27/14

[52] U.S. Cl. ........................................ 428/268; 427/96; 428/285; 428/323; 428/328; 428/329; 428/332; 428/339; 428/418; 428/469; 428/472; 428/432

[58] Field of Search ................ 428/268, 285, 286, 332, 428/901, 339, 328, 329, 325, 323, 469, 472, 418, 471, 432; 427/96; 174/68.5

[56] References Cited

U.S. PATENT DOCUMENTS

| | | | |
|---|---|---|---|
| 3,360,391 | 12/1967 | Richtzenhain et al. | 428/329 |
| 3,427,189 | 2/1969 | Brechna | 428/242 |
| 3,511,690 | 5/1970 | Aharoni | 428/329 |
| 3,808,042 | 4/1974 | Dietz | 427/96 |

FOREIGN PATENT DOCUMENTS 46-25756  4/1971  Japan .

Primary Examiner—Paul J. Thibodeau
Attorney, Agent, or Firm—Armstrong, Nikaido, Marmelstein & Kubovcik

[57] ABSTRACT

In the manufacture of a wiring board, or a heat discharge plates and the like in the field of the electronics, composite materials consisting of substrates and organic polymeric materials and epoxy resin, as well as ceramic materials such as alumina plates, have heretofore been used as substrates of printed wiring boards and heat sinks. These substrate materials, however, are defective in that, because of a low thermal conductivity and an insufficient heat radiation.

A highly thermal conductive and electrical insulating substrate of the invention comprises a highly thermal conductive metal plate, such as aluminum, and a film formed thereon, said film being composed of a dispersion of metal oxide particles having a shape factor, of 1 to 1.4, and also, having a polyhedral shape including smooth surfaces in an adhesive organic polymer. The space factor is an average value of the long diameter/-short diameter ratio of the metal oxide particles.

9 Claims, 4 Drawing Figures

HIGHLY THERMAL CONDUCTIVE AND ELECTRICAL INSULATING SUBSTRATE

The present invention relates to an electrical insulating substrate having a good thermal conductivity, which is used for the manufacture of a wiring board, or a heat discharge plates and the like in the field of the electronics.

Composite materials consisting of substrates and organic polymeric materials, such as laminates made of a paper substrate and a phenolic resin or a glass substrate and epoxy resin, as well as ceramic materials such as alumina plates, have heretofore been used as substrates of printed wiring boards and heat sinks. These substrate materials, however, are defective in that, because of a low thermal conductivity and an insufficient heat radiation, highly heat-generating elements such as IC, MSI and LSI cannot be arranged or packed on the substrates at high densities.

Accordingly, substrates comprising as a base a metal excellent in the thermal resistance and thermal conductivity have been developed. For example, there have been developed a composite laminate comprising a metal and an organic polymeric material, and a metal-ceramic composite plate comprising an electrical insulating alumilite film formed on an aluminum plate. These substrates, however, are still defective. In the former substrate, the thermal resistance is increased because of the presence of the organic polymeric material, and in the latter substrate, when the temperature of the alumilite film is elevated, the alumilite film is cracked, resulting in degradation of the electrical insulating properties.

It is an object of the present invention to provide a novel substrate having a low thermal resistance and a good electrical insulating property.

In accordance with the object of the present invention, there is provided a highly thermal conductive and electrical insulating substrate comprising a highly thermal conductive metal plate, such as aluminum, and a film formed thereon, said film being composed of a dispersion of metal oxide particles having a shape factor, defined hereinbelow, of 1 to 1.4, and also, having a polyhedral shape including smooth surfaces in an adhesive organic polymer.

BRIEF DESCRIPTION OF THE DRAWINGS

The present invention will be explained below with reference to the drawings, wherein:

FIG. 2-(b) is a sectional view showing the comparative electrical insulating substrate, and;

DETAILED DESCRIPTION OF THE INVENTION

Figure 1:
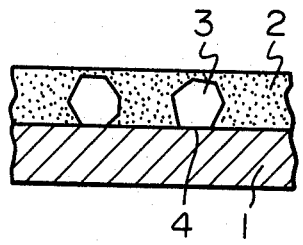
FIG. 1 is a sectional view showing the electrical insulating substrate according to the present invention.

A composite laminate consisting of a metal and an organic polymer material is defective, as pointed out hereinbefore, in that the thermal resistance is high. If an electrical insulating inorganic filler having a good thermal conductivity, such as alumina or silica, is incorporated in the organic polymer material, the thermal resistance can be lowered to some extent. However, since an ordinarily available inorganic filler is formed by pulverizing a product obtained by the wet process or the dry method, and it has a complicated surface including convexities and concavities, the surfaces of the particles adhere to the substrate mainly through point contacts. This contact state is diagramatically illustrated in FIG. 2-(a), where reference numerals 1, 2 and 5 represent a substrate such as an aluminum plate, an organic polymer and an inorganic filler such as alumina or silica, respectively. The filler 5 is in contact with the substrate 1 at contact points 6. Accordingly, although the filler per se has a good thermal conductivity, heat is not sufficiently conducted to the substrate.

In the present invention, the inorganic filler is used in the form of particles having a specific shape factor and a polyhedral shape, such as rectangular, pentagonal, hexahedral and octahedral shapes, including smooth surfaces preferably in the formed of polyhedral particles, most of which are defined by smooth surfaces. By virtue of this feature, in the present invention, face-to-face contacts are produced between the substrate and the particles, and the filling property and other characteristics can be improved over the conventional composite laminate.

Referring to FIG. 1, which illustrates diagrammatically the substrate of the present invention, reference numeral 1 represents a metal plate, for example, an aluminum plate, and this may be an alumilite-treated one though not specifically shown in the drawings. Reference numeral 2 represents an adhesive organic polymer and metal oxide particles 3 having a shape factor of 1 to 1.4, and having smooth surfaces are dispersed in the organic polymer 2. One side surface 4 of the polyhedral particles is brought into face-to-face contact with the aluminum plate.

The "shape factor" referred to in the present invention is determined in the following manner.

Particles are dispersed in the stable state on a flat plate, and with respect to each particle, the long diameter and the short diameter intersecting the long diameter at a right angle are measured according to the microscope magnification method specified in JIS (Japanese Industrial Standard) R-6002. The average value of the long diameter/short diameter ratio is calculated. The number of the measured particles is ordinarily 200. According to this method, the long diameter and short diameter are measured in the state where the particles are stably placed on the plane plate. If the above-mentioned ratio is lower than 1.4, also plate-like particles are included. If the shape factor exceeds 1.4, the filling property is reduced and the thermal conductivity is lowered. Accordingly, particles having a shape factor exceeding 1.4 are not used in the present invention. In case of particles having a large shape factor, for example, particles having a shape 7 shown in FIG. 2-(b), particles partially overlap one another, and the areas of these overlapping particles are ordinarily small, which is one cause of reduction of the thermal conductivity. On the other hand, in case of plate-like particles having a shape factor not exceeding 1.4, the filling property in the coating film is not degraded and the contact area between the substrate and the particles is large. Furthermore, even if such particles partially overlap one another, the contact area among the particles is large because the filling property of the particles is good, and therefore, a good thermal conductivity is ensured.

Figure 2A:
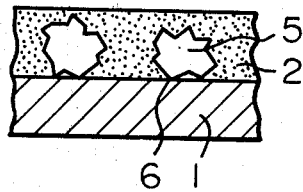
FIG. 2-(a) is a sectional view showing the conventional electrical insulating substrate.
Figure 2B:
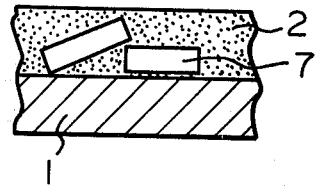

In FIGS. 1 and 2-(a), there is illustrated the state in which the particles are arranged in one layer in the organic polymer layer. Of course, the particles may be randomly arranged and dispersed in many layers in the organic polymer according to the size of the particles and the like. In this case, the side surfaces of particles should naturally be brought in contact with one another. However, since the particles used in the present invention have smooth surfaces, the area of the contact among the particles is increased, and this increased contact area has good influences on conduction of the heat.

If the size of the particles is too large, the thickness of the film is naturally increased. Accordingly, it is ordinarily preferred that the particle size be not more than 200 microns, especially not more than 100 microns. On the other hand, if the particle size is too small, the effects by the use of polyhedral particles are reduced. Therefore, it is preferred that the particles size be not less than 2 microns.

Furthermore, it is preferred that the thermal conductivity of the particles be high.

As particles satisfying the foregoing requirements, that can be industrially manufactured, there can be mentioned particles of metal oxides selected from the group of $Al_2O_3$, $SiO_2$ and $TiO_2$. Corundum particles ($Al_2O_3$) are especially preferred because polyhedral and plate-like particles can easily be obtained according to the hydrothermal synthesis process.

As the highly thermal conductive plate, there can be used plates of aluminum, copper, silver, nickel and titanium, iron. From the viewpoints of the price and weight, a plate of aluminum, alumite-treated (anodic oxidation) aluminum or iron is especially preferred. The thickness of such metal plate is ordinarily 0.5 to 3 mm.

As the adhesive organic polymer, there can be used, for example, resins such as epoxy and phenolic resins, and rubbers such as silicone rubbers.

When the amount of the metal oxide particles dispersed in the organic polymer is small, the thermal conductivity is low. On the other hand, if the amount of the metal oxide particles is large, it becomes difficult to form a strong film. Accordingly, it is preferred that the volume of the particles occupying the film be 5 to 55%, especially 10 to 50%, based on the total volume of the film. The volume corresponding to 2 to 30% in the particle-occupying volume of 5 to 55% may be occupied by commercially available fine ceramic powder (such as hexagonal BN, BeO or $SiO_2$) having a particle size smaller than that of the metal oxide particles, so far as the strength of the film is not drastically reduced. When such fine particles are incorporated, they are interposed among the metal oxide particles and the thermal conductivity of the film can further be enhanced.

The dispersion of the metal oxide particles and the organic polymer, may be applied on a glass fiber or glass-fiber cloth. The glass-fiber cloth is bonded on the metal plate in such a manner that the surface thereof, on which the dispersion is applied, is in contact with the metal plate. When the dispersion is applied on the glass-fiber cloth, the thickness of the dispersion film and, hence, the thermal resistance as well as the breakdown voltage of the composite film are advantageously uniform.

The thickness of the film is variable depending on the purpose of using the substrate, but is conveniently from 0.01 to 0.2 mm, especially from 0.01 to 0.2 mm.

The method for forming the film of the substrate of the present invention will now be described.

In the case of alumina, silica and titania, granular or plate-like polyhedral particles having a shape factor of 1 to 1.4 can be obtained by the hydrothermal synthesis method. For example, granular polyhedral alumina particles having a shape factor of 1 to 1.4, the majority of which are surrounded by smooth surfaces, can be obtained according to the method disclosed in Japanese Patent Application Laid-Open Specification No. 15498/77 (U.S. Pat. No. 4,193,768), and plate-like alumina particles can be obtained according to the method disclosed in Japanese Patent Publication No. 7750/62.

These particles are sufficiently blended and dispersed in the above-mentioned organic polymer, and a curing agent and other additives are incorporated into the dispersion. The dispersion is coated on one or both of the surfaces of the metal plate by spraying or printing, and is then dried and cured.

When the highly thermal conductive and electrical insulating substrate of the present invention is used as the substrate of a wiring board, a copper foil is disposed or copper plating layer is formed on the film surface and a printed circuit is formed on the copper film or plating layer. When the substrate of the present invention is used for a heat sink, a heat discharge grease is coated on both the surfaces, and the substrate is inserted and fixed between a transistor and a heat sink, and is used in this state. Incidentally, when the film including a rubbery adhesive is applied to the metal plate in the substrate of the present invention, the heat discharge grease need not be used in some cases.

EXAMPLE 1

Corundum particles were prepared by the hydrothermal synthesis process using aluminum hydroxide as raw material and Bayer alumina as the seed crystal. The so prepared corundum particles were used as the metal oxide particles. Most of the particles were granular polyhedral particles surrounded by smooth surfaces. (See Japanese Patent Application Laid-Open Specification No. 15498/77 with respect to the process of the preparation of the corundum particles used.) Properties of the particles are shown in Table 1, below.

The particles (250 g) were well mixed with 100 g of an epoxy resin (Epikote 828 manufactured by Shell Chemicals Co.) (the volume of the particles in the mixture was 38%). An imidazole type curing agent (manufactured by Shikoku Kasei K. K.) was incorporated into the mixture. The resulting composition was coated on one surface of an alumilit-treated aluminum plate having a thickness of 1 mm. The coating operation was carried out by spray coating and by using a bar coater. The thickness of the coating film was 0.06 mm.

For comparison, a substrate was prepared in the same manner as described above, except that a pulverized product of electrofused alumina was used instead of the above-mentioned corundum.

Figure 3:
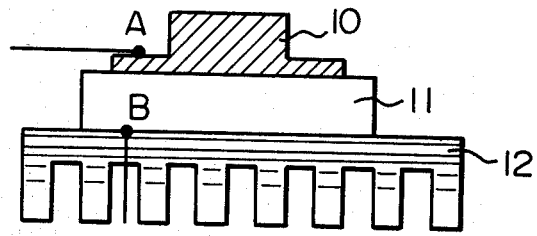
FIG. 3 is a sectional view illustrating the state where the thermal conductivity of the substrate is measured.

The temperature differences were determined by using an apparatus illustrated in FIG. 3, so as to compare these substrates with respect to the thermal conductivity. In FIG. 3, a transistor 10 of the type TO-3 was attached to the top face of the substrate 11. The bottom face of the substrate was connected to heat sink 12 composed of aluminum. In order to attain a tight adhesion, a heat discharge silicone grease was interposed between the transistor and the substrate. The temperature gradient produced by the heat generated by the transistor was determined and the thermal conductivity was evaluated based on the difference of the temperature between the points A and B in FIG. 3. The obtained results are shown in Table 1.

TABLE 1

| | Present Invention | | Comparison |
|---|---|---|---|
| Particles | corundum by hydro thermal synthesis | | pulverized product of electrofused alumina |
| Paticles size ($\mu$) | 4–16 | | 4–17 |
| Surface configuration | polyhedral particles having smooth surfaces | | complex surfaces including convexities and concavities |
| Shape factor | 1.10 | 1.30 | 1.65 |
| Temperature difference (°C.) | 2.5 | 2.6 | 3.5 |

EXAMPLE 2

In 500 cc of a silica sol (having a particle size of 15 m$\mu$, having a concentration of 20%, 3 g of pulverized silica having a particle size of 3$\mu$ was incorporated, and the mixture was charged in an autoclave. The reaction was carried out at 400° C., under 400 kg/cm², to form hydrothermal synthesis silica. A substrate was prepared in the same manner as described in Example 1, except that this silica was used instead of the corundum used in Example 1. The thermal conductivity was determined by the method of Example 1. For comparison, a substrate was prepared in the same manner as described above, except that pulverized silica was used instead of the above hydrothermal synthesis silica. The obtained results are shown in Table 2.

TABLE 2

| | Present Invention | | Comparison |
|---|---|---|---|
| Particles | hydrothermal synthesis silica | | pulverized silica |
| Particle size ($\mu$) | 6–14 | | 6–14 |
| Surface configuration | smooth polyhedron | | complex surfaces including convexities and concavities |
| Shape factor | 1.15 | 1.35 | 1.5 |
| Temperature difference (°C.) | 3.0 | 3.2 | 3.9 |

EXAMPLE 3

The same process as in Example 1 was repeated, except that a 1 mm thick iron plate was used as the metal plate. The properties of the metal oxide particles and the measurement result of temperature difference are shown in Table 3.

TABLE 3

| | Present Invention | | Comparison |
|---|---|---|---|
| Particles | hydrothermal synthesis silica | | pulverized silica |
| Particle size ($\mu$) | 5–60 | | 6–14 |
| Surface configuration | smooth polyhedron | | complex surfaces including convexities and concavities |
| Shape factor | 1.10 | 1.30 | 1.65 |
| Temperature difference (°C.) | 3.0 | 3.1 | 4.2 |

We claim:

1. A highly thermal conductive and electrical insulating substrate comprising a highly thermal conductive metal plate and a film formed thereon, said film being composed of a dispersion of metal oxide particles having a shape factor of 1 to 1.4 and also having a polyhedral shape including smooth surfaces in an adhesive organic polymer said metal oxide particles being positioned on said metal plate in face-to-face contact therewith.

2. A highly thermal conductive and electrical insulating substrate according to claim 1, wherein said metal oxide is selected from the group consisting of Al$_2$O$_3$, SiO$_2$ and TiO$_2$.

3. A highly thermal conductive and electrical insulating substrate according to claim 2, wherein said metal oxide particles are polyhedral corundum (Al$_2$O$_3$) particles having smooth crystal growth faces, which are prepared according to the hydrothermal synthesis process.

4. A highly thermal conductive and electrical insulating substrate according to claim 3, wherein the particle size is in the range of from 2 to 200 microns.

5. A highly thermal conductive and electrical insulating substrate according to claim 4, wherein the volume of said metal oxide particles occupying said film is in the range of from 5 to 55%.

6. A highly thermal conductive and electrical insulating substrate according to claim 5, wherein a volume corresponding to 2 to 30% in the particle-occupying volume of said 5 to 55% is occupied by commercially available fine ceramic powder having a particle size smaller than that of said metal oxide particles.

7. A highly thermal conductive and electrical insulating substrate according to claim 5, wherein the thickness of said film is in the range of from 0.01 to 0.2 mm.

8. A highly thermal conductive and electrical insulating substrate according to claim 1, wherein the highly thermal conductive metal plate is composed of aluminum, alumilite-treated aluminum or iron.

9. A highly thermal conductive and electrical insulating substrate according to claim 8, wherein said dispersion is applied on a glass-fiber cloth, which cloth is bonded on said highly thermal conductive metal plate in such a manner that the dispersion-applied surface is in contact with said highly thermal conductive metal plate.

* * * * *